(12) United States Patent
Kao et al.

(10) Patent No.: US 8,797,098 B2
(45) Date of Patent: Aug. 5, 2014

(54) VARIABLE GAIN AMPLIFIER

(75) Inventors: Shuo-Chun Kao, Sunnyvale, CA (US); Nikola Nedovic, San Jose, CA (US)

(73) Assignee: Fujitsu Limited, Kawasaki-shi (JP)

( * ) Notice: Subject to any disclaimer, the term of this patent is extended or adjusted under 35 U.S.C. 154(b) by 50 days.

(21) Appl. No.: 13/477,926

(22) Filed: May 22, 2012

(65) Prior Publication Data

US 2013/0314156 A1    Nov. 28, 2013

(51) Int. Cl.
*H03F 3/45* (2006.01)
(52) U.S. Cl.
CPC .................................. *H03F 3/45* (2013.01)
USPC .......................................... 330/251; 330/283
(58) Field of Classification Search
CPC ............................................................ H03F 3/45
USPC .................................. 330/254, 283
See application file for complete search history.

(56) References Cited

U.S. PATENT DOCUMENTS

| 6,630,864 B2 * | 10/2003 | Yang ........................... 330/254 |
| 6,919,761 B2 | 7/2005 | Cho et al. ........................ 330/51 |
| 2006/0022748 A1 | 2/2006 | Udagawa ........................ 330/51 |

* cited by examiner

*Primary Examiner* — Robert Pascal
*Assistant Examiner* — Khiem Nguyen
(74) *Attorney, Agent, or Firm* — Baker Botts L.L.P.

(57) ABSTRACT

A method may include applying an input differential voltage to input terminals of an amplifier, a first input terminal coupled to a gate of a first transistor and a second input terminal coupled to a gate of a second transistor. The method may also include varying a gain of the amplifier by varying at least one of: a resistance of a first resistor, the first resistor coupled between a source of the first transistor and a source of the second transistor; and a resistance of a second resistor, the second resistor coupled between a source of a third transistor and a source of a fourth transistor; wherein: the third transistor is coupled at its drain to the drain of the first transistor; and the fourth transistor is coupled at its drain to the drain of the second transistor and a gate of the third transistor and coupled at its gate to the drain of the third transistor.

20 Claims, 1 Drawing Sheet

VARIABLE GAIN AMPLIFIER

TECHNICAL FIELD

The present invention relates generally to electrical circuits, and more particularly, to variable gain amplifiers.

BACKGROUND

An electronic amplifier is a device for increasing the power of a signal. In basic operation, an electronic amplifier uses energy from a power supply and controls its output to match an input signal shape but with a larger amplitude. Amplifiers are used in many electronics applications, including in communications, audio systems, servo motor controllers, and many other applications.

A key operational parameter of any amplifier is its gain. A gain is typically a multiplicative factor relating the magnitude of the output signal to the input signal. The gain may be specified as the ratio of output voltage to input voltage (voltage gain), output power to input power (power gain), or some combination of current, voltage and power. In some applications, it is beneficial that an amplifier have a variable gain, wherein the gain of the amplifier may be modified or changed. However, existing approaches to adapting conventional amplifiers to provide for variable gain have disadvantages.

To illustrate, reference is made to FIG. 1, which depicts a conventional amplifier 100, as is known in the art. A conventional amplifier may comprise transistors 108a, 108b, drain resistors 112a, 112b, and current source 106. Each drain resistor 112a, 112b may be coupled between the drain terminal of a corresponding transistor 108a, 108b, respectively, and a high potential voltage source (e.g., $V_{DD}$). Each transistor 108a, 108b may in turn be coupled at its gate terminal to a differential input (e.g., $V_{in}^+$ or $V_{in}^-$) and at its source terminal to current source 106.

In operation, transistors 108a, 108b form a differential transistor pair to sense and track the input data represented by a differential input voltage $V_{in}$, and producing a differential output voltage $V_{out}$ at the drain terminals of transistors 108a, 108b. Those of skill in the art will appreciate that the gain A of amplifier 100 may be given by the equation $A=g_{m1} \cdot R_D$, where $g_{m1}$ is the transconductance of each transistor 108a, 108b and $R_D$ is the resistance of each resistor 112a, 112b. Thus, to make the gain A variable, one or both of $g_{m1}$ and $R_D$ must be made variable. For example, $R_D$ may be variable if resistors 112a, 112b are replaced with variable resistors. As another example, those of skill in the art will appreciate that $g_{m1}$ is a function of $I_{SS}$, the tail current generated by current source 106. Accordingly, $g_{m1}$ may be varied by varying $I_{SS}$, which it turn varies the gain A. However, as those of skill in the art will appreciate, the common mode output voltage $V_{cm,\,out}$ of amplifier 100 may be given by the equation $V_{cm,out}=V_{DD}-I_{SS} \cdot R_D/2$. Thus, adjusting the gain by changing either of $g_{m1}$ or $R_D$ will lead to a change in the output common mode voltage. Changing the output common mode of amplifier 100 may be undesirable, as it disturbs the bias condition of the circuit.

SUMMARY

In accordance with some embodiments of the present disclosure, a method may include applying an input differential voltage to input terminals of an amplifier, the input terminals comprising a first input terminal and a second input terminal, the first input terminal coupled to a gate terminal of a first transistor and the second input terminal coupled to a gate terminal of a second transistor. The method may also include varying a gain of the amplifier by varying at least one of: a resistance of a first resistor, the first resistor coupled between a source terminal of the first transistor and a source terminal of the second transistor; and a resistance of a second resistor, the second resistor coupled between a source terminal of a third transistor and a source terminal of a fourth transistor; wherein: the third transistor is coupled at its drain terminal to the drain terminal of the first transistor; and the fourth transistor is coupled at its drain terminal to the drain terminal of the second transistor and a gate terminal of the third transistor and coupled at its gate terminal to the drain terminal of the third transistor.

One or more technical advantages of the present disclosure may be readily apparent to one skilled in the art from the figures, descriptions, and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

The present disclosure may refer to the "size" of various types of transistors, including an n-type metal-oxide semiconductor field-effect transistor (NMOS). Unless otherwise specified, the description of a transistor's size, as used herein, describes the size parameter that affects the transconductance of the transistor. For example, for NMOS devices, "size" may refer to the width-to-length ratio of the gate and/or of the conducting channel of the device. Accordingly, a device that is described as being sized at a ratio as compared to another device may have a transconductance that is larger or smaller at that ratio as compared to the transconductance of the other device.

Further, the term "equivalent" may be used to describe two or more currents or two or more voltage potentials that may be designed to be approximately equal to each other. Though they may be designed to be approximately equal to each other, "equivalent" voltages, "equivalent" currents, or other "equivalent" items may include some variation due to factors including, but not limited to, device matching imperfections, semiconductor processing imperfections, and/or imbalanced operating conditions.

Figure 1:
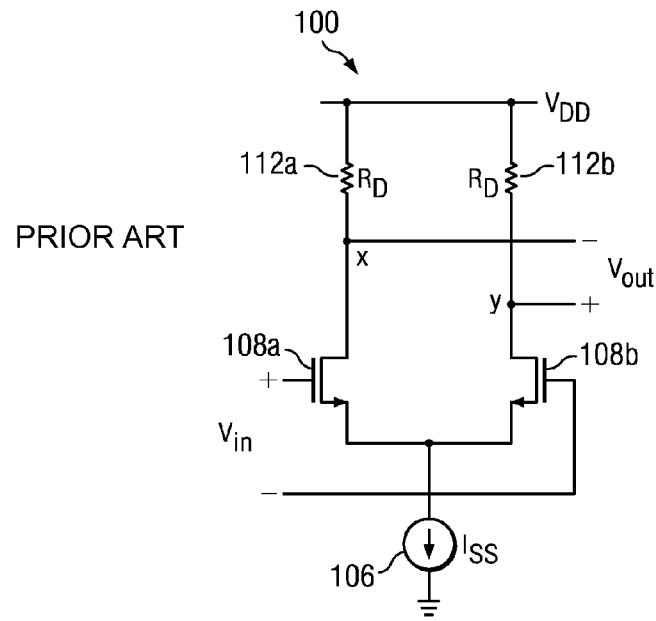
FIG. 1 illustrates a schematic diagram of an example conventional amplifier, as is known in the art.
Figure 2:
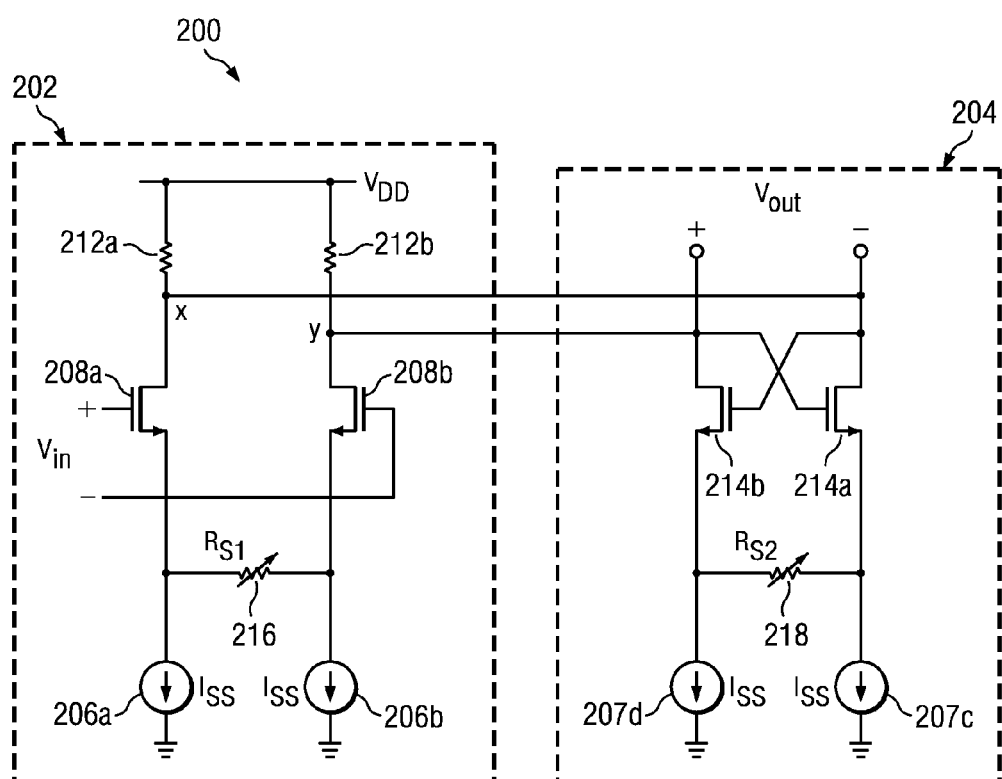
FIG. 2 illustrates a schematic diagram of a variable gain amplifier, in accordance with certain embodiments of the present disclosure.

FIG. 2 illustrates a schematic diagram of an example variable gain amplifier, in accordance with certain embodiments of the present disclosure. Power may be supplied to variable gain amplifier 200 through a high potential power supply and a low potential power supply. For the purposes of this disclosure, a high potential power supply may be referred to as "$V_{DD}$", and a low potential power supply may be referred to as "GND" or "$V_{SS}$".

As shown in FIG. 2, variable gain amplifier 200 may comprise a first stage 202 and a second stage 204. First stage 202 may comprise transistors 208a, 208b, resistors 212a, 212b, variable resistor 216, and current sources 206a, 206b. Each resistor 212a, 212b may be coupled between the drain terminal of a corresponding transistor 208a, 208b, respectively, and a high potential voltage source (e.g., $V_{DD}$). Transistors 208a, 208b may in turn be respectively coupled at their gate terminals to opposite polarities of a differential input (e.g., $V_{in}^+$ or $V_{in}^-$). In addition, each transistor 208a, 208b may be coupled at its source terminal to a corresponding current source 206a, 206b, respectively. In some embodiments, transistors 208a and 208b may be of approximately the same size. Furthermore, variable resistor 216 may be coupled between the source terminals of transistors 208a and 208b.

Second stage 204 may comprise transistors 214a, 214b, variable resistor 218, and current sources 207a, 207b. Each of transistors 214a, 214b may be coupled at its drain terminal to the drain terminal of a corresponding first stage transistor 208a, 208b, respectively. Furthermore, each transistor 214a, 214b may be coupled at its source terminal to a corresponding current source 207a, 207b, respectively. In addition, transistors 214a and 214b may be cross-coupled such that the gate terminal of transistor 214a is coupled to the drain terminal of transistor 214b, and vice versa. In some embodiments, transistors 214a and 214b may be of approximately the same size. Variable resistor 218 may be coupled between the source terminals of transistors 214a and 214b.

A gain A of amplifier 200 may be given by $A = G_{m1} \cdot R_L$, where $G_{m1}$ is the effective transconductance of first stage 202 as seen at the output $V_{out}$ of amplifier 200, and $R_L$ is the effective load resistance as seen at the output $V_{out}$ of amplifier 200. The effective transconductance $G_{m1}$ may be given by:

$$G_{m1} = g_{m1}/(1 + g_{m1} \cdot R_{S1}/2)$$

where $g_{m1}$ is the transconductance of each transistor 208a and 208b and $R_{S1}$ is the resistance of variable resistor 216.

The effective load resistance $R_L$ may be given by:

$$R_L = R_D/(1 - G_{m2} \cdot R_D)$$

where $R_D$ is the resistance of resistors 212a, 212b and $G_{m2}$ is the effective transconductance of second stage 204 as seen at the output $V_{out}$ of amplifier 200. The transconductance $G_{m2}$ may be given by:

$$G_{m2} = g_{m2}/(1 + g_{m2} \cdot R_{S2}/2)$$

where $g_{m2}$ is the transconductance of each transistor 214a and 214b and $R_{S2}$ is the resistance of variable resistor 218.

By variable substitution, the gain A may be given by:

$$A = \frac{g_{m1}}{1 + g_{m1} \cdot \frac{R_{S1}}{2}} \cdot \frac{R_D}{1 - \frac{g_{m2}}{1 + g_{m2} \cdot \frac{R_{S2}}{2}} \cdot R_D}$$

Accordingly, as seen by the above equations, negative resistance is added by second stage 204 in order to modulate the effective load resistance $R_L$. In addition, so long as transistors 214a, 214b (corresponding to $g_{m2}$) and the resistance $R_{S2}$ of variable resistor 218 are selected such that effective load resistance $R_L > 0$, amplifier 200 will operate as an amplifier. Variable gain of amplifier 200 may be accomplished by modifying one or both of variable resistors 216 and 218, without affecting the common mode voltage of the output of amplifier 200 (which may be given by the equation $V_{cm,out} = V_{DD} - I_{SS} \cdot R_D/2$, where $V_{DD}$ is the supply voltage, $I_{SS}$ is the tail current generated by each of current source 206a, 206b, and $R_D$ is the resistance of each of resistor 212a, 212b).

Although FIG. 2 depicts current sources 206a, 206b, 207a, and 207b all generating tail currents equal to $I_{SS}$, other embodiments in which currents generated by current sources 206a and 206b may be substantially different than those generated by current sources 207a and 207b.

As used herein, a current source (e.g., current source 206a, 206b, 207a, and/or 207b) may include any electrical or electronic device configured to deliver or absorb electric current.

As used herein, a transistor (e.g., transistor 208a, 208b, 214a, and/or 214b) may comprise any system, device, or apparatus configured to control a signal at a pair of its terminals by a signal applied to another pair of its terminals. Although the FIGURES of this disclosure depicts transistors as n-type complementary metal-oxide-semiconductor field-effect transistors, transistors may include any other suitable type of transistor (e.g., n-type complementary metal-oxide-semiconductor field-effect transistors, bipolar junction transistors, junction-gate field effect transistors, insulated gate bipolar transistors, etc.).

As used herein, a resistor (e.g., resistor 212a and/or 212b) may comprise any electronic component that produces a voltage across its terminals that is proportional to the electric current passing through it in accordance with Ohm's law.

As used herein, a variable resistor (e.g., variable resistor 216 and/or 218) may comprise any electronic component that produces a voltage across its terminals that is proportional to the electric current passing through it in accordance with Ohm's law, wherein such proportion between voltage and current may be varied based on a control signal or other stimulus provided to the variable resistor.

All examples and conditional language recited herein are intended for pedagogical objects to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An amplifier, comprising:
 a first stage comprising:
  a first transistor coupled at its gate terminal to a first input terminal of the amplifier;
  a second transistor coupled at its gate terminal to a second input terminal of the amplifier, the first input terminal and the second input terminal comprising a differential voltage input;
  a first resistor coupled between a drain terminal of the first transistor and a high potential voltage source;
  a second resistor coupled between a drain terminal of the second transistor and the high potential voltage source;
  a first current source coupled to a source terminal of the first transistor;
  a second current source coupled to a source terminal of the second transistor; and
  a first variable resistor coupled between the source terminal of the first transistor and the source terminal of the second transistor; and
 a second stage comprising:
  a third transistor directly coupled at its drain terminal to the drain terminal of the first transistor;
  a fourth transistor directly coupled at its drain terminal to the drain terminal of the second transistor, coupled at its gate terminal to the drain terminal of the third transistor, and coupled at its drain terminal to a gate terminal of the third transistor;
a third current source coupled to a source terminal of the third transistor;
a fourth current source coupled to a source terminal of the fourth transistor; and
a second variable resistor coupled between the source terminal of the third transistor and the source terminal of the fourth transistor.

2. The amplifier of claim 1, wherein at least one of a resistance of the first variable resistor and a resistance of the second variable resistor may be modified in order to modify a gain of the amplifier.

3. The amplifier of claim 1, wherein at least one of a resistance of the second variable resistor, a transconductance of the third transistor, and a transconductance of the fourth transistor is selected such that an effective between the drain terminal of the first transistor and the drain terminal of the second transistor is positive.

4. The amplifier of claim 1, wherein the first resistor and the second resistor have approximately the same resistance.

5. The amplifier of claim 1, wherein the first current source and the second current source are configured to generate approximately the same current.

6. The amplifier of claim 1, wherein the third current source and the fourth current source are configured to generate approximately the same current.

7. The amplifier of claim 1, wherein the first current source, the second current source, the third current source, and the fourth current source are configured to generate approximately the same current.

8. The amplifier of claim 1, further comprising:
the drain terminal of the first transistor coupled to a first output terminal of the amplifier; and
the drain terminal of the second transistor coupled to a second output terminal of the amplifier, the first output terminal and the second output terminal comprising a differential voltage output.

9. The amplifier of claim 1, wherein at least one of the first transistor, the second transistor, the third transistor, and the fourth transistor comprises a complementary metal-oxide-semiconductor transistor.

10. The amplifier of claim 1, wherein at least one of the first transistor, the second transistor, the third transistor, and the fourth transistor comprises an n-type metal-oxide-semiconductor transistor.

11. A method, comprising:
applying an input differential voltage to input terminals of an amplifier, the input terminals comprising a first input terminal and a second input terminal, the first input terminal coupled to a gate terminal of a first transistor and the second input terminal coupled to a gate terminal of a second transistor; and
varying a gain of the amplifier by varying at least one of:
a resistance of a first resistor, the first resistor coupled between a source terminal of the first transistor and a source terminal of the second transistor; and
a resistance of a second resistor, the second resistor coupled between a source terminal of a third transistor and a source terminal of a fourth transistor; wherein:
the third transistor is directly coupled at its drain terminal to the drain terminal of the first transistor; and
the fourth transistor is directly coupled at its drain terminal to the drain terminal of the second transistor and a gate terminal of the third transistor and coupled at its gate terminal to the drain terminal of the third transistor.

12. The method of claim 11, wherein the drain terminal of the first transistor and the drain terminal of the second transistor are coupled to a high voltage potential power supply via a first resistor and a second resistor, respectively.

13. The method of claim 12, wherein the first resistor and the second resistor have approximately the same resistance.

14. The method of claim 11, wherein the first transistor and the second transistor are respectively coupled to a first current source and a second current source, respectively.

15. The method of claim 14, wherein the first current source and the second current source are configured to generate approximately the same current.

16. The method of claim 11, wherein the third transistor and the fourth transistor are respectively coupled to a first current source and a second current source, respectively.

17. The method of claim 16, wherein the first current source and the second current source are configured to generate approximately the same current.

18. The method of claim 11, wherein at least one of a resistance of the second variable resistor, a transconductance of the third transistor, and a transconductance of the fourth transistor is selected such that an effective between the drain terminal of the first transistor and the drain terminal of the second transistor is positive.

19. The method of claim 11, wherein at least one of the first transistor, the second transistor, the third transistor, and the fourth transistor comprises a complementary metal-oxide-semiconductor transistor.

20. The method of claim 11, wherein at least one of the first transistor, the second transistor, the third transistor, and the fourth transistor comprises an n-type metal-oxide-semiconductor transistor.

* * * * *